(12) United States Patent
Do et al.

(10) Patent No.: US 6,960,767 B1
(45) Date of Patent: Nov. 1, 2005

(54) APPARATUS FOR MEASURING FEATURES OF A SEMICONDUCTOR DEVICE

(75) Inventors: Douglas D. Do, Boise, ID (US); Jeff C. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 421 days.

(21) Appl. No.: 09/629,022

(22) Filed: Jul. 31, 2000

Related U.S. Application Data

(62) Division of application No. 09/083,835, filed on May 22, 1998, now Pat. No. 6,124,140.

(51) Int. Cl.[7] .......................... G21K 7/00; G21K 1/08; G01K 1/08
(52) U.S. Cl. ...................... 250/311; 250/310; 250/397; 250/396 ML
(58) Field of Search ............................... 250/310, 307, 250/492.2, 308, 311, 492.1, 397, 396 ML

(56) References Cited

U.S. PATENT DOCUMENTS

| | | | |
|---|---|---|---|
| 3,715,580 A | * | 2/1973 | Maekawa et al. ............ 250/397 |
| 4,209,702 A | * | 6/1980 | Shirai et al. ......... 250/396 ML |
| 4,390,789 A | * | 6/1983 | Smith et al. .............. 250/492.2 |
| 4,447,731 A | * | 5/1984 | Kuni et al. ............... 250/442.1 |
| 4,600,839 A | * | 7/1986 | Ichihashi et al. ........... 250/310 |
| 4,694,178 A | * | 9/1987 | Harte ..................... 250/396 R |
| 4,868,395 A | * | 9/1989 | Kasahara et al. ........... 250/398 |
| 5,006,795 A | * | 4/1991 | Yoshizawa et al. ......... 324/158 |
| 5,097,127 A | * | 3/1992 | Hildenbrand et al. ....... 250/310 |
| 5,225,676 A | * | 7/1993 | Matsuya ...................... 250/311 |
| 5,412,209 A | * | 5/1995 | Otaka et al. ................ 250/310 |
| 5,430,292 A | * | 7/1995 | Honjo et al. ................ 250/310 |
| 5,512,746 A | | 4/1996 | Saito .......................... 250/310 |
| 5,557,105 A | * | 9/1996 | Honjo et al. ................ 250/310 |
| 5,747,816 A | * | 5/1998 | Kurosaki ................. 250/491.1 |
| 5,834,783 A | * | 11/1998 | Muraki et al. .............. 250/398 |
| 5,892,224 A | * | 4/1999 | Nakasuji ..................... 250/310 |
| 5,986,263 A | * | 11/1999 | Hiroi et al. ................. 250/310 |
| 6,014,200 A | * | 1/2000 | Sogard et al. ................ 355/53 |
| 6,075,373 A | * | 6/2000 | Iino ........................... 324/754 |
| 6,114,695 A | * | 9/2000 | Todokoro et al. ........... 250/310 |

(Continued)

FOREIGN PATENT DOCUMENTS

JP         3066488 A         3/1991

OTHER PUBLICATIONS

Fuse et al., "Focusing Optical System for Dual-Beam Laser Cutting and Welding," *Sumitomo Electric Technical Review*, 42: 87-93, 1996 (abstract only).

(Continued)

*Primary Examiner*—John R. Lee
*Assistant Examiner*—Kalimah Fernandez
(74) *Attorney, Agent, or Firm*—Dorsey & Whitney LLP

(57) ABSTRACT

A method and apparatus for measuring the dimensions of features on the surface of a semiconductor device. The method may include passing a first electron beam having a first depth of focus over the semiconductor device and passing a second electron beam having a second depth of focus over the device. Electrical signals generated by the two electron beams may be analyzed singly or in combination to determine the lateral or vertical dimensions of the features at one or more positions relative to the surface of the semiconductor device. In one embodiment, the first and second electron beams are generated sequentially from a single electron gun. In another embodiment, the first and second electron beams are generated sequentially or simultaneously by either two separate electron guns or a single electron gun positioned proximate to two separate electron beam ports.

8 Claims, 6 Drawing Sheets

U.S. PATENT DOCUMENTS

| | | | |
|---|---|---|---|
| 6,166,380 A * | 12/2000 | Kitagawa et al. | 250/307 |
| 6,278,114 B1 * | 8/2001 | Mitsui | 250/310 |
| 6,465,783 B1 * | 10/2002 | Nakasuji | 250/311 |
| 6,593,584 B2 * | 7/2003 | Krans et al. | 250/492.2 |
| 6,734,428 B2 * | 5/2004 | Parker et al. | 250/310 |

OTHER PUBLICATIONS

"The S-8000 Series CD-Measurement SEM and Applications," *Hitachi Scientific Instrument Technical Data—SEM,* No. 67, front cover, p. 2, back cover, 1995.

* cited by examiner

DISTANCE IN X DIRECTION

APPARATUS FOR MEASURING FEATURES OF A SEMICONDUCTOR DEVICE

CROSS-REFERENCE TO RELATED APPLICATIONS

This application is a divisional of U.S. patent application Ser. No. 09/083,835, filed May 22, 1998, now U.S. Pat. No. 6,124,140.

TECHNICAL FIELD

The present invention relates to methods and devices for measuring the dimensions of features of semiconductor devices.

BACKGROUND OF THE INVENTION

Semiconductor devices typically include a wafer comprising silicon or another semiconductor material that is etched or otherwise processed to form circuit elements. The wafer typically includes surface features, such as electrical contacts or other components, that either project upward from the surface of the wafer or form depressions or concavities in the surface of the wafer. Once the wafer has been processed, it may be desirable to examine the features under a microscope and measure the dimensions of the features to ensure that they conform to design specifications. Because the features are typically too small to resolve with visible light, which has a relatively large wavelength, the wafers are typically examined with short-wavelength electron beams under a scanning electron microscope (SEM).

One conventional method for analyzing a semiconductor wafer with a SEM includes scanning the wafer with an electron beam that is either reflected by the features, or causes the features to emit secondary electrons. The reflected or emitted electrons are received by a detector that generates a voltage signal corresponding to the rate at which the electrons are received. The voltage signal changes as a function of the orientation of the features and may be used to create an image having contrasting light and dark regions, similar in appearance to a conventional photograph. The distances between the light and dark regions may then be measured to determine the dimensions of the features.

Where the features of the semiconductor wafer are spaced relatively far apart, the electron beam may be relatively wide and may have a relatively large depth of focus, so that the electron beam may resolve features having a wide range of heights or depths relative to the surface of the wafer. As electronic devices are made smaller and smaller, the spacing between the features on the surface of the wafer becomes smaller and smaller, and the aspect ratio of the spaces between the features increases. To adequately resolve the closely-spaced features, it has become necessary to reduce the width of the electron beam.

One drawback with conventional electron beam techniques is that, when the width of the electron beam is reduced, the depth of focus of the beam is also reduced. Accordingly, the electron beam may not be accurately focused on any relevant portion of the feature, or may be accurately focused on only one relevant portion of the feature. For example, where the beam is not accurately focused on the edges of the feature, it may be difficult to locate the edges of the feature, and may accordingly be difficult to determine the dimensions of the feature. Where the electron beam is focused on only one portion of the feature, only that portion may be accurately measured. For example, where the feature is tapered and the dimensions of the feature vary with distance from the surface of the wafer, the dimensions may only be accurately measured at the portion of the feature near the focal point of the electron beam.

Electron beams in a SEM may be automatically focused using split beam techniques or other procedures. However, a drawback with conventional SEM automatic focusing methods is that, upon reviewing the image created by the SEM, it may not be clear which portion of the feature is in focus. If the dimensions of the feature change as a function of distance from the surface of the wafer (e.g., if the feature is tapered), it may be difficult to determine which portion of the feature the resulting measurement corresponds to. The resulting measurements may therefore be inaccurate.

SUMMARY OF THE INVENTION

The present invention is directed toward a method and apparatus for measuring the dimensions of semiconductor substrate features. The apparatus may include at least one source of electrons positioned above a stage that supports the semiconductor device. The apparatus may further include a port surface having two ports positioned between the electron source and the support to generate two electron beams. Alternatively, the apparatus may include two electron sources to generate two electron beams. The electron beams pass through the ports and through focusing devices that may focus one electron beam on a first position relative to the semiconductor device and may focus the other electron beam at a second position relative to the semiconductor device. The support may be moved relative to the electron beams to scan the electron beams across the semiconductor device. Electrons that are either reflected or emitted by the semiconductor device when the electron beams impinge thereon may be received by detectors positioned above the semiconductor device. The detector may generate signals corresponding to the intensity of the flow of electrons it receives, and the signals may be used to generate a representation corresponding to the edges of the semiconductor device features. For example, the representation may include a graphical image or a table indicating the intensity of the reflected or emitted beams as a function of the distance traversed by the incident beam across the semiconductor device.

Alternatively, an electron beam having a first depth of focus may be scanned over the semiconductor device to create a first reflected or emitted beam. The electron beam may be re-focused to have a second depth of focus and a second reflected or emitted beam may be generated by scanning the electron beam at the second depth of focus over the semiconductor device. A user may measure the lateral dimensions of the features of the semiconductor device by analyzing, either separately or together, a graphical or tabular representation of the reflected or emitted beams.

The user may alternatively measure a height or a depth of the semiconductor device feature by analyzing signals reflected by or emitted from the device when an electron beam having a first depth of focus is focused on one portion of the feature and an electron beam having a second depth of focus is focused on another portion of the feature. The height or depth of the feature may be correlated with the difference between the two depths of focus.

DETAILED DESCRIPTION OF THE INVENTION

The present invention is directed toward methods and apparatuses for measuring the dimensions of features of a semiconductor device. The method may include scanning the semiconductor device with an electron beam focused first at one depth and then at a second depth, or may include scanning the semiconductor device with two separate electron beams, each focused at a different depth. Many specific details of certain embodiments of the invention are set forth in the following description and in FIGS. 1–6 to provide a thorough understanding of such embodiments. One skilled in the art, however, will understand that the present invention may have additional embodiments and that they may be practiced without several of the details described in the following description.

Figure 1:
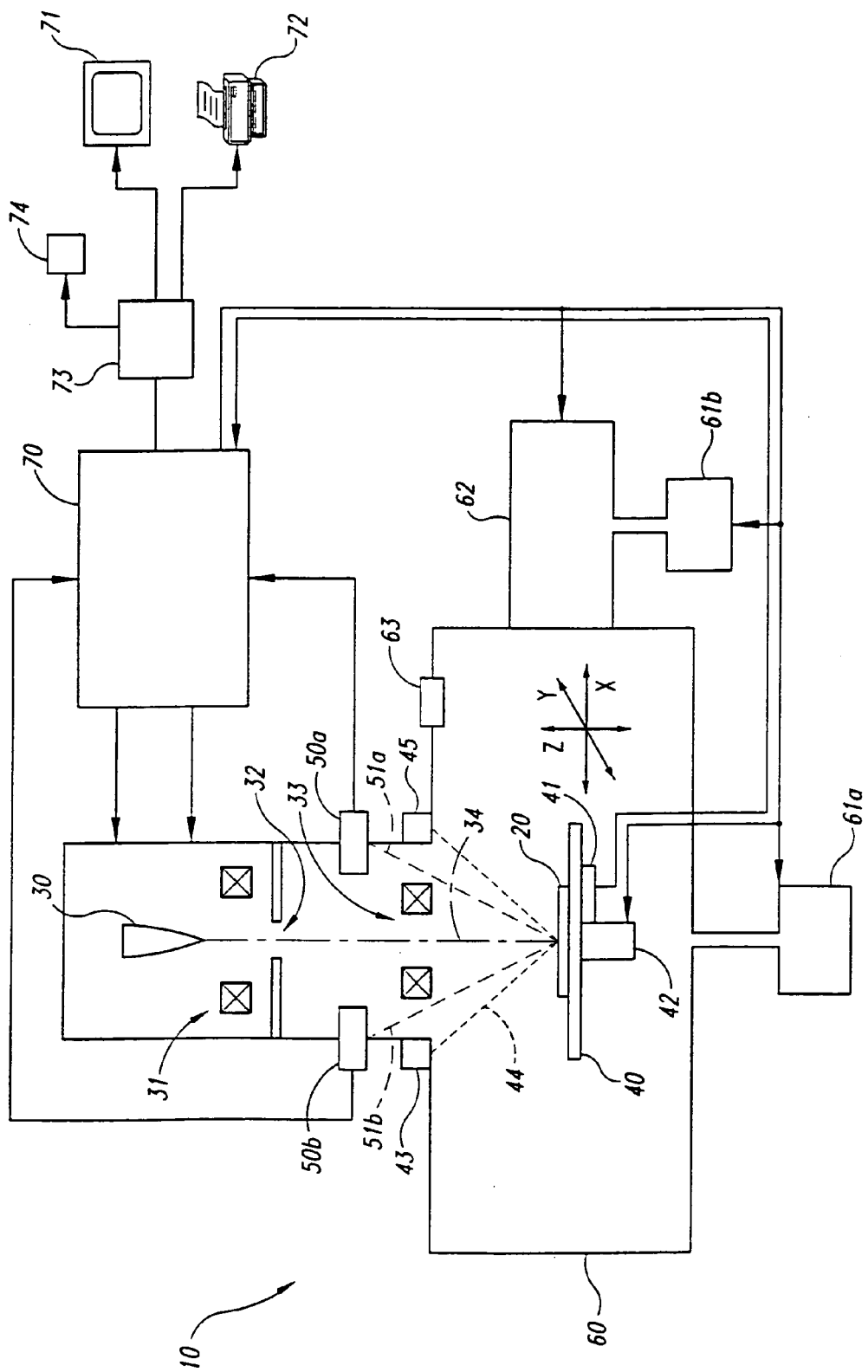
FIG. 1 is a schematic side elevation view of an apparatus in accordance with an embodiment of the invention supporting a semiconductor substrate.

FIG. 1 is a schematic side elevation view of an electron beam apparatus 10 in accordance with an embodiment of the invention. The apparatus 10 includes a vacuum chamber 60 in which is housed an electron gun 30. The electron gun 30 directs an electron beam 34 toward a semiconductor device or substrate 20 positioned on a support or stage 40 beneath the electron gun. The stage 40 moves relative to the electron beam 34 such that the electron beam scans across the semiconductor substrate 20. Electrons reflected or emitted by the semiconductor substrate 20 are received by two detectors 50 (shown as 50a and 50b). The detectors 50 transmit to a controller 70 and a processor 73 signals corresponding to the strength or intensity of the reflected beam. The data generated by the processor 73 are then analyzed to determine the dimensions of features on the semiconductor substrate 20.

The vacuum chamber 60 is coupled to two vacuum sources 61 (shown as 61a and 61b). One vacuum source 61a evacuates the main portion of the vacuum chamber 60 and the other vacuum source 61b evacuates a loading bay 62 connected to the vacuum chamber 60. Semiconductor substrates 20 may be loaded in the loading bay 62 while it is at atmospheric pressure and a vacuum is maintained in the vacuum chamber 60. The vacuum source 61b is then activated to lower the pressure in the loading bay 62 until it matches the vacuum pressure in the vacuum chamber 60, at which point the substrate 20 is moved into the vacuum chamber 60. Accordingly, the vacuum pressure in the vacuum chamber 60 may be maintained at less than atmospheric levels while the semiconductor substrate 20 is moved into and out of the vacuum chamber.

The semiconductor substrate 20 is transported from the loading bay 62 into the vacuum chamber 60 on the stage 40. A drive unit 42 is coupled to the stage 40 and moves the stage in three orthogonal directions, as indicated by arrows X, Y, and Z. The stage 40 includes a sensor 41 that tracks the location of the stage as it moves, and transmits to the controller 70 signals corresponding to the location of the stage. A light source 43 may be positioned above the stage 40 to separately measure the vertical position of the stage 40 by generating a light beam 44 that is reflected from the stage 40 and/or the semiconductor substrate 20 and received by a light detector 45. An optical microscope 63 may also be positioned above the stage 40 for visual inspection of the stage 40 and the semiconductor substrate 20.

The electron beam 34 emitted by the electron gun 30 passes through a condenser lens 31 that concentrates the electron beam 34, then through an aperture 32, and through an objective lens 33 that further concentrates the electron beam. The lenses 31 and 33 may include charged plates or other known means for focusing the electron beam 34. In one embodiment, the electron beam 34 strikes the semiconductor substrate 20 and is reflected in several directions. In another embodiment, the electron beam 34 strikes the semiconductor substrate 20 which in turn emits secondary electrons in several directions. The term secondary beam is used herein to refer to electron beams reflected by and/or emitted by the semiconductor substrate 20. For purposes of clarity, two secondary beams 51 (shown as 51a and 51b) are shown in FIG. 1, though it will be understood that the secondary electrons may form other beams that travel in directions other than those shown in FIG. 1.

In one embodiment, the two electron detectors 50 are positioned above the stage 40 to receive the two secondary beams 51. Other embodiments may include a greater or lesser number of electron detectors 50. In the embodiment shown in FIG. 1, the electron detectors 50 are positioned on opposite sides of the semiconductor substrate 20. Accordingly, a right electron detector 50a will tend to receive the right secondary beam 51a, which includes electrons emanating from rightward facing features, and the left electron detector 50b will tend to receive the left secondary beam 51b, which includes electrons emanating from leftward facing features, as will be discussed in greater detail below with respect to FIG. 2A.

When the secondary beams 51 strike the electron detectors 50, they generate electrical signals that are transmitted to the controller 70. The signals proceed from the controller 70 to the processor 73 where they are reduced to human readable representations, as will be discussed in greater detail below with reference to FIGS. 2B–2F. The representations may be displayed on a display 71 and/or may be printed on a printer 72, and/or may be stored on an electronic storage device 74 for subsequent processing.

The processor 70 is also coupled to the electron gun 30, the lenses 31 and 33, the vacuum sources 61, the loading bay 62, and the drive unit 42. Accordingly, the controller 70 may control the motion of the semiconductor substrate 20 into and out of the vacuum chamber 60 and the motion of the semiconductor substrate 20 and the electron beam 34 relative to each other.

In operation, the controller 70 controls the electron gun 30 and the lenses 31 and 33 to produce an electron beam 34 having a selected depth of focus. The drive unit 42 moves the stage 40 into position beneath the electron gun 30 and moves the stage in the Z direction so that the electron beam 34 is focused on a selected portion of the semiconductor substrate 20. The drive unit 42 then moves the stage 40 in the X and Y directions to scan the electron beam 34 in a series of parallel paths across the semiconductor substrate 20, producing the secondary beams 51 that are received by the electron detectors 50 and processed by the processor 73.

Figure 2A:
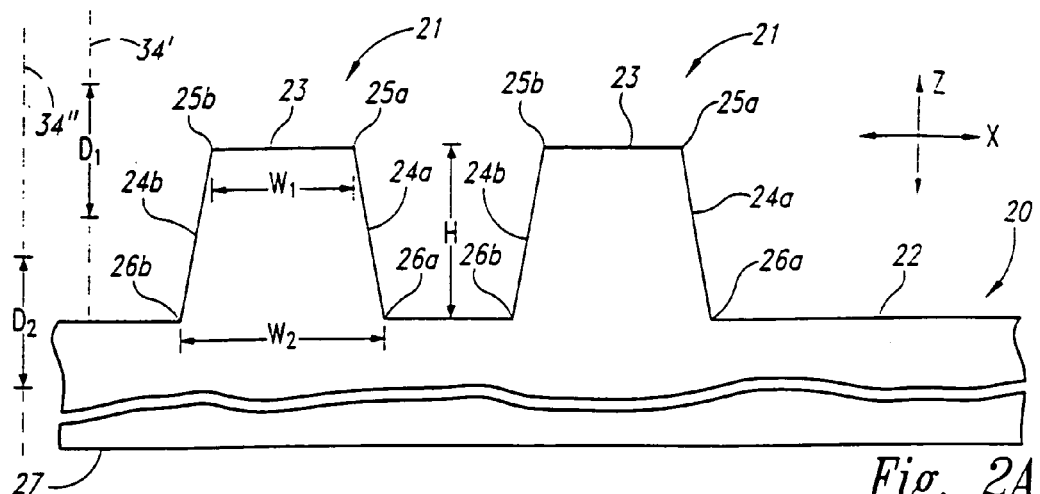
FIG. 2A is a detailed side elevation view of the semiconductor substrate of FIG. 1.

FIG. 2A is a side elevation view of an example of the semiconductor substrate 20. In the embodiment shown in FIG. 2A, the semiconductor substrate 20 has a top surface 22, a bottom surface 27, and two raised features 21 projecting above the top surface 22. In other embodiments, the semiconductor substrate 20 may have more than two features and/or may have features that are recessed from the top surface 22. Each feature 21 has an upper surface 23, upper corners 25 (shown as 25a and 25b), side surfaces 24 (shown as 24a and 24b), and lower corners 26 (shown as 26a and 26b).

Figure 2B:
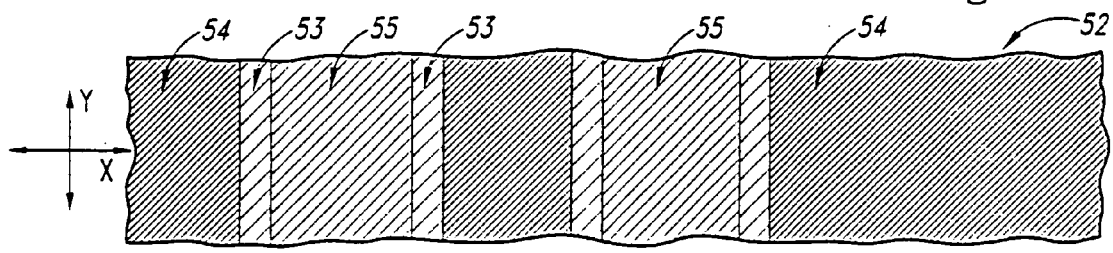
FIG. 2B is an image of a surface of the semiconductor substrate of FIG. 2A generated by the apparatus of FIG. 1.

The semiconductor substrate may be scanned by a first electron beam 34' having a depth of focus $D_1$ centered on the upper corners 25 of the features 21, and by a second electron beam 34" having a depth of focus $D_2$ centered on the lower corners 26 of the feature. When the first electron beam 34' scans across the semiconductor substrate 20, the detectors 50 (FIG. 1) generate a series of electrical signals corresponding to the secondary beams 51 (FIG. 1). FIG. 2B is a plan view of a two-dimensional image 52 generated from the signals and having a pattern of contrasting regions corresponding to the features 21 and the top surface 22 of the semiconductor substrate 20. As shown in FIG. 2B, dark regions 54 correspond to the substrate top surface 22, light regions 53 correspond to the side surfaces 24 of the features 21, and gray regions 55 correspond to the upper surfaces 23 of the features.

Figure 2C:
FIG. 2C is a graph of voltage as a function of distance obtained from the image of FIG. 2B and corresponding to signals detected by a first detector and generated by an electron beam having a first depth of focus.
Figure 2D:
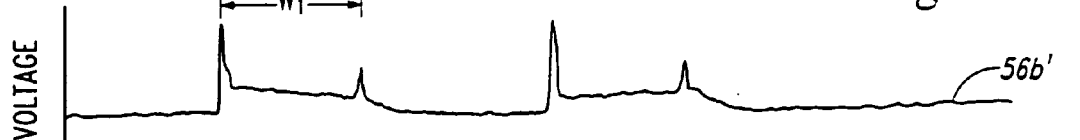
FIG. 2D is a graph of voltage as a function of distance obtained from the image of FIG. 2B and corresponding to signals detected by a second detector and generated by an electron beam having the first depth of focus.
Figure 2E:
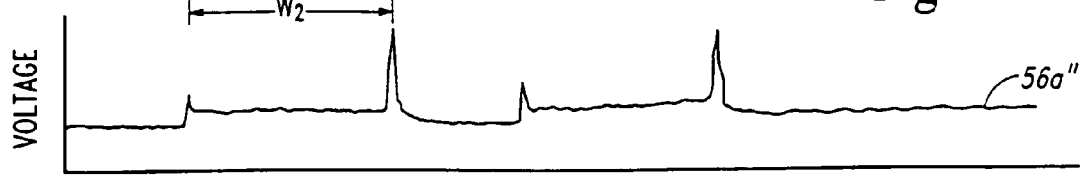
FIG. 2E is a graph of voltage as a function of distance obtained from the image of FIG. 2B and corresponding to signals detected by the first detector and generated by an electron beam having a second depth of focus.
Figure 2F:
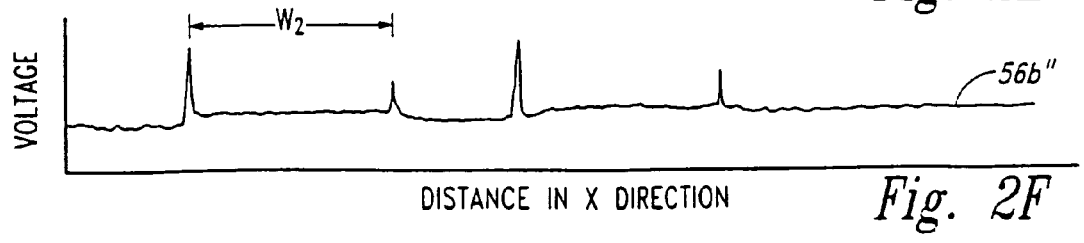
FIG. 2F is a graph of voltage as a function of distance obtained from the image of FIG. 2B and corresponding to signals detected by the second detector and generated by an electron beam having the second depth of focus.

In one embodiment, the data for a given portion of the image 52 may be collapsed to produce a single graph of voltage (corresponding to the intensity of the secondary beam 51 (FIG. 1)) as a function of distance in the X direction. For example, FIG. 2C is a graph of a voltage signal 56a' as a function of distance in the X direction, as detected by the right electron detector 51a (FIG. 1). The signal 56a' has major spikes corresponding to the right upper corners 25a (facing toward the right detector 51a), and minor spikes corresponding to the left upper corners 25b (facing away from the right detector 51a). FIG. 2D is a similar graph of a voltage signal 56b' corresponding to the reflected intensity of the secondary beam 50b (FIG. 1) as detected by the left detector 51b (FIG. 1). A user may measure a width $W_1$ of the feature upper surface 23 by measuring the corresponding distance between the peaks shown in FIGS. 2C and/or 2D. In one embodiment, the user may use the voltage signal that most sharply defines the region of interest. For example, the user may use the voltage signal 56a' to accurately locate the right upper corners 25a and the voltage signal 56b' to accurately locate the left upper corners 25b.

In a manner similar to that discussed above with reference to FIGS. 2B–2D, the user may then generate another image (not shown) corresponding to electrons received from the semiconductor substrate 20 when it is impinged by the second electron beam 34". The data corresponding to the image may be collapsed to produce a voltage signal 56a" (shown in FIG. 2E) corresponding to the secondary beam 51a received by the right electron detector 50a, and a voltage signal 56b" (shown in FIG. 2F) corresponding to the secondary beam 51b received by the left electron detector 50b. A width $W_2$ of the base of feature 21 may be measured from the traces 56a" and 56b", in a manner similar to that discussed above with reference to FIGS. 2C–2D.

Figure 3A:
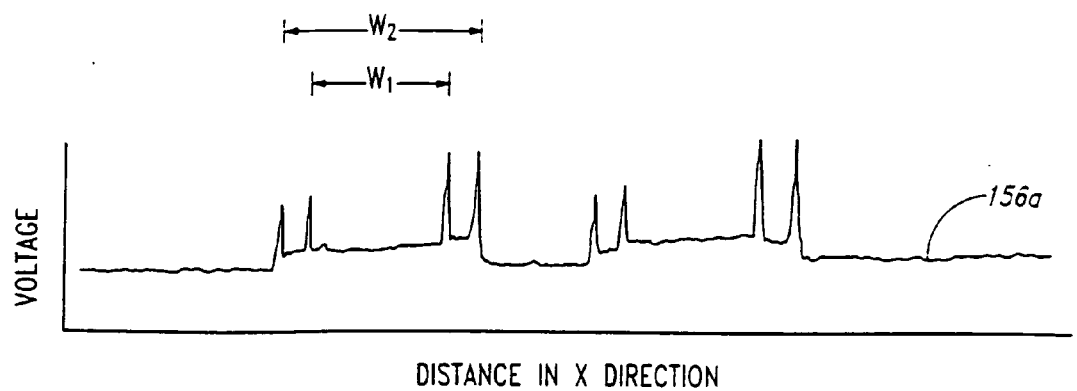
FIG. 3A is a graph of a combination of the voltages shown in FIGS. 2C and 2E.
Figure 3B:
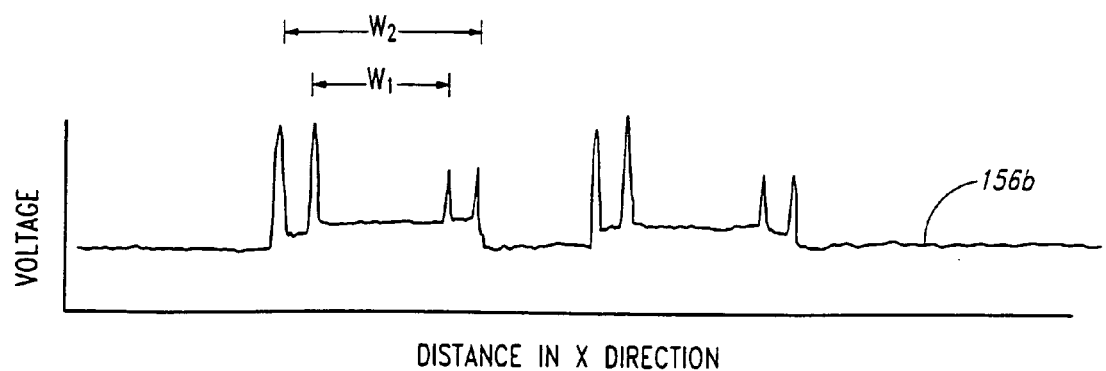
FIG. 3B is a graph of a combination of the voltages shown in FIGS. 2D and 2F.

In another aspect of this embodiment, the voltage signals 56a' and 56a" may be combined to form a single voltage signal 56a corresponding to the signal received by the right detector 50a (FIG. 1), as shown in FIG. 3A. Similarly, the voltage signals 56b' and 56b" may be combined to form a single trace 56b corresponding to the signal received by the left detector 50b (FIG. 1), as shown in FIG. 3B. The traces 56a and 56b may more clearly indicate the feature dimensions $W_1$ and $W_2$ in a single graph. In yet a further embodiment, the traces 56a and 56b may also be combined to form a single, composite signal.

Returning to FIG. 2A, other representations or combinations of representations may be used to determine the dimensions of the features 21 in other embodiments, so long as more than one electron beam is used to generate the representation. For example, in one such embodiment, a tabular representation of the voltage generated by the secondary beams 51 (FIG. 1) as a function of distance may be generated and analyzed to determine the dimensions of the features 21. In another embodiment, more than two electron beams 34, each having a different depth of focus, may be used to determine the width of a feature 21 at more than two distances from the top surface 22 of the semiconductor substrate 20. In still another embodiment, the user may analyze the data to determine dimensions other than the width of the feature 21. For example, in one such embodiment, the data may be used to determine a dimension of the feature 21 in the Y direction (FIG. 2B). In another such embodiment, the user may determine the height H of the feature 21 by taking the difference in distance in the Z direction between the focal points of the electron beams 34' and 34" and correlating the difference with corresponding known feature heights.

An advantage of the method and apparatus discussed above with reference to FIGS. 1–3B is that an electron beam 34 may be focused to have two different depths of focus corresponding to different heights of the feature 21 on the surface of the semiconductor substrate 20. Accordingly, the lateral dimensions of the feature 21 at each height may be determined, even if the dimensions are different at each height. Another advantage of the method and apparatus is that an electron beam 34 having a relatively small depth of focus may be used to resolve different portions of the feature in sharp focus by first scanning the feature with the electron beam focused at one depth and then scanning the same feature with the electron beam focused at a different depth. Yet a further advantage is that the height or depth of the feature may be determined by scanning the feature with an electron beam or beams 34 having different depths of focus.

Figure 4A:
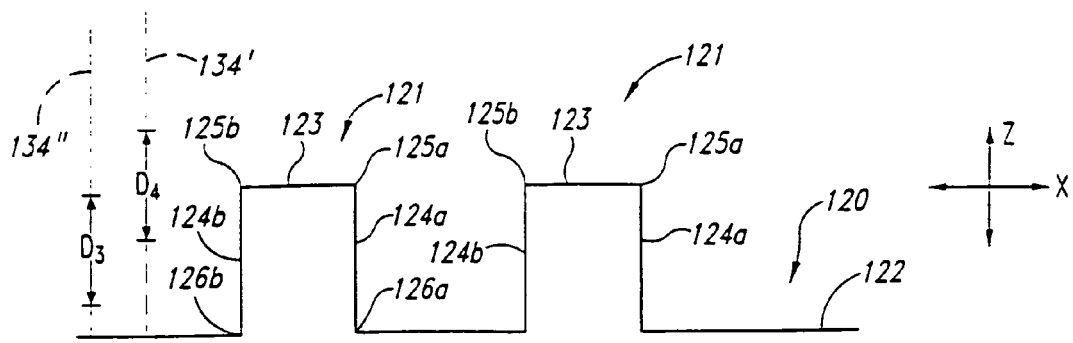
FIG. 4A is a side elevation view of another semiconductor substrate and two electron beams focused above a surface thereof.
Figure 4B:
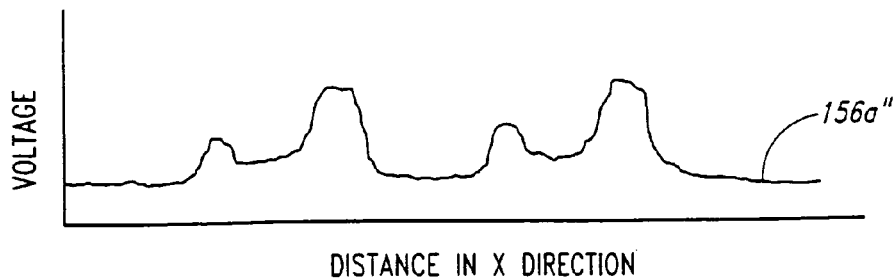
FIG. 4B is a graph of voltage as a function of distance corresponding to signals generated by an electron beam impinging on the semiconductor substrate of FIG. 4A and having a first depth of focus.

FIG. 4A is a side view of a semiconductor substrate 120 having a top surface 122 and raised features 121 with vertical side surfaces 124 (shown as 124a and 124b). An electron beam 134" having a depth of focus $D_3$ centered between the upper corners 125 (shown as 125a and 125b) and the lower corners 126 (shown as 126a and 126b) of the features 121 may be scanned over the semiconductor substrate 120. FIG. 4B is a graph of the resulting voltage signal 156a", as detected by the right detector 50a (FIG. 1). As shown in FIG. 4B, the voltage signal 156a" has relatively ill-defined peaks. When the focal point is shifted either upward or downward, the peaks may be more sharply defined. For example, the focal point may be shifted upward, such that an electron beam 134' has a depth of focus $D_4$ approximately centered at the upper corners 125a of the features 121. The resulting voltage signal 156a', shown in FIG. 4C, has more sharply defined peaks that more clearly indicate the corners 125 and 126 of the feature 121.

Figure 4C:
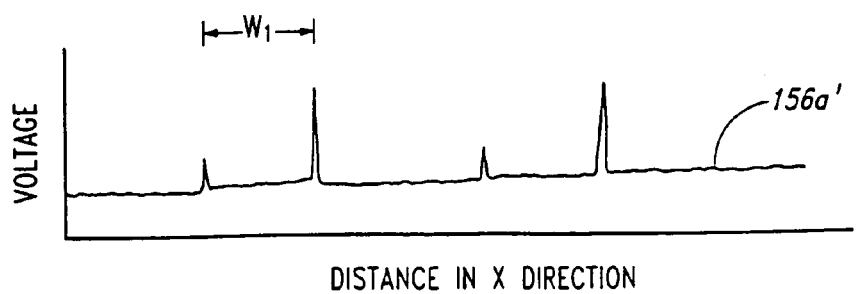
FIG. 4C is a graph of voltage as a function of distance corresponding to signals generated by an electron beam impinging on the semiconductor substrate of FIG. 4A and having a second depth of focus.

Referring to FIGS. 4A–4C, a method in accordance with one embodiment of the invention may include selecting a voltage signal that has a more sharply defined change in voltage as a function of distance, and measuring the width $W_1$ between peaks of the selected signal. In one aspect of this embodiment, where the width $W_1$ is the same at both the upper and lower corners 125 and 126, the selected signal may correspond to a depth of focus centered on either the upper corners 125 or the lower corners 126. The signal having the more sharply defined change in voltage as a function of distance may be selected manually by visually inspecting the traces 156a' and 156a" or automatically, for example with software that determines the slope and location of the spikes shown in FIGS. 4B–4C. Once the desired depth of focus has been established, any remaining unscanned portions of the semiconductor substrate 120, or other substrates, may be scanned with an electron beam having the same depth of focus.

An advantage of the method discussed above with reference to FIGS. 4A–4C when compared to the method discussed above with reference to FIGS. 2A–2F is that it may be less time-consuming to focus the electron beam sharply at a single location. This method may be particularly applicable where the feature has a constant width as a function of distance from the top surface 122 of the substrate 120. Conversely, an advantage of the method discussed above with reference to FIGS. 2A–2F is that by sharply focusing an electron beam on both the substrate top surface 122 and the feature upper surface 123, the dimensions of a feature may be readily determined, even if the feature has different widths as a function of distance from the top surface.

Figure 5:
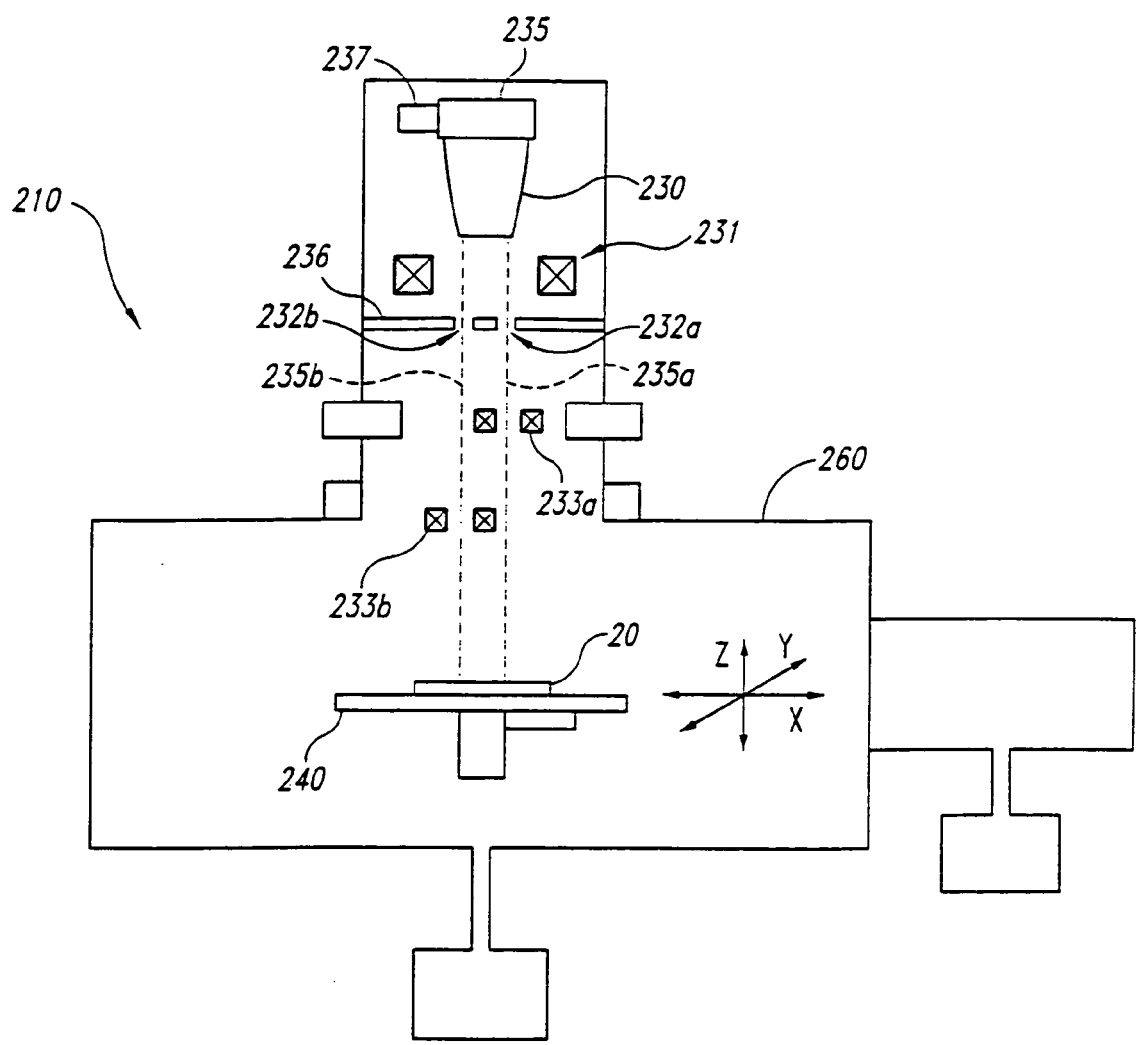
FIG. 5 is a schematic side elevation view of a portion of an apparatus having two ports in accordance with another embodiment of the invention.

FIG. 5 is a schematic side elevation view of an apparatus 210 in accordance with another embodiment of the invention. The apparatus 210 includes a vacuum chamber 260 having an electron gun 230 positioned above the stage 240 on which the substrate 20 is positioned. The electron gun 230 may be coupled to a drive unit 235 that moves the electron gun in the Z direction. A position detector 237 may be coupled to the electron gun 230 to track the movement of the electron gun. Electrons generated by the electron gun 230 pass through the condenser lens 231 and through two apertures or ports 232 (shown as 232a and 232b) in a port surface 236 to form two electron beams 235 (shown as 235a and 235b). The electron beams 235 are focused by corresponding objective lenses 233 (shown as 233a and 233b) before impinging on the semiconductor substrate 20.

In one aspect of this embodiment, the position of the substrate 20 relative to the focal points of the electron beams 235 may be changed by manipulating the lenses 231 and 233. In another aspect of this embodiment, the position of the semiconductor substrate 20 may be changed by moving the stage 240 relative to the electron gun 230. In yet another aspect of this embodiment, the relative position between the semiconductor substrate 20 and the focal points of the electron beams 235 may be changed by moving the electron gun 230 along the Z axis with the drive unit 235.

Each of the electron beams 235 may be focused at a different point along the Z axis. In one embodiment, the aperture 235b may be blocked and the semiconductor substrate 20 may be scanned by the one electron beam 235a. The aperture 235b may then be uncovered and the aperture 235a blocked and the semiconductor substrate 20 may be scanned with the other electron beam 235b. In another embodiment, the semiconductor substrate 20 may be scanned by both electron beams 235a and 235b simultaneously to produce a composite image and voltage signals similar to those shown in FIGS. 3A and 3B. Accordingly, one advantage of the apparatus 210 shown in FIG. 5 is that it may be less time-consuming to scan the semiconductor substrate 20 simultaneously with two electron beams, each having a different depth of focus. Conversely, an advantage of the device 10 shown in FIG. 1 is that for some semiconductor substrates 20, it may be more convenient to analyze separate images corresponding to electron beams having different depths of focus that it is to analyze the composite image and voltage signals data discussed above with reference to FIG. 5.

Figure 6:
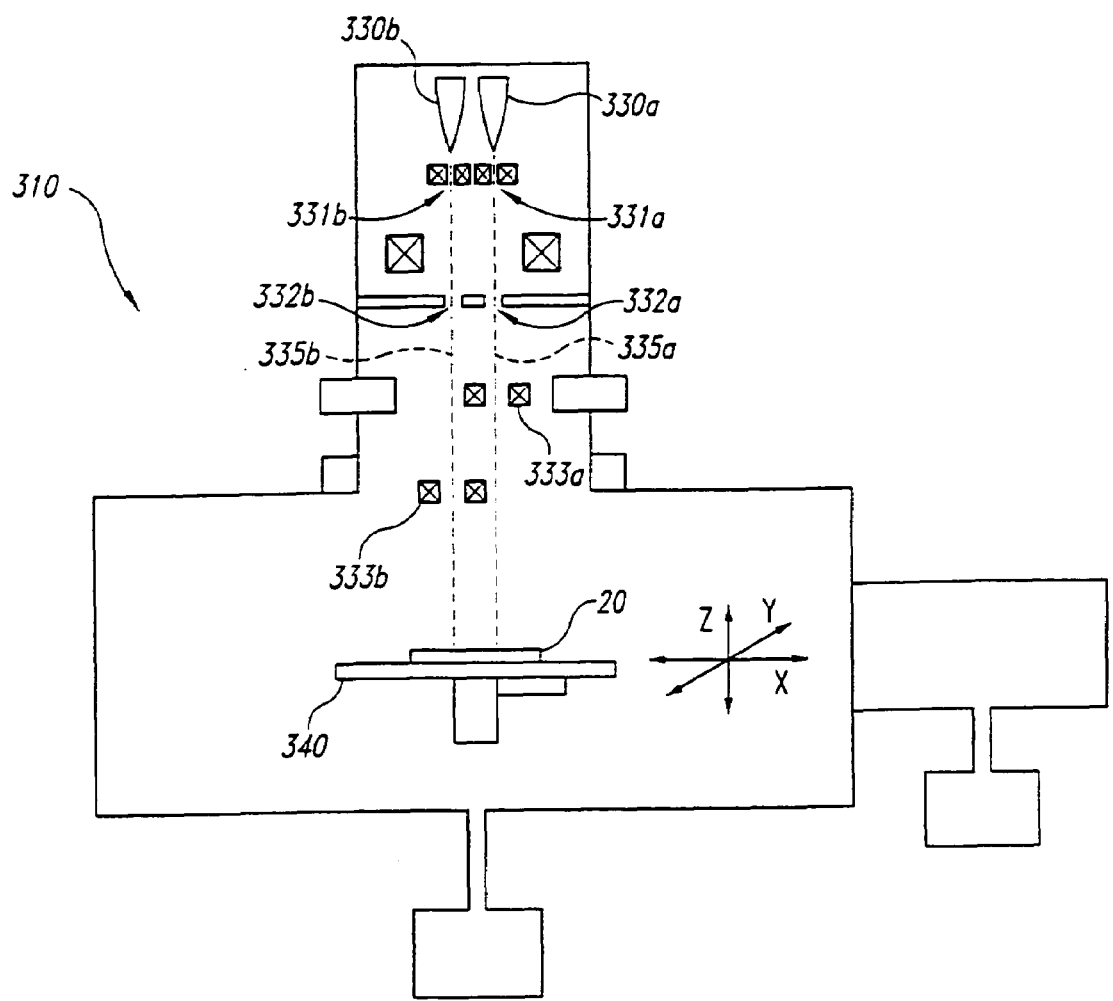
FIG. 6 is a side elevation schematic of a portion of an apparatus having two electron guns in accordance with still another embodiment of the invention.

FIG. 6 is a schematic side elevation view of an apparatus 310 in accordance with another embodiment of the invention having two electron guns 330 (shown as 330a and 330b) positioned above a stage 340 and the semiconductor substrate 20. The apparatus 310 further includes two corresponding condenser lenses 331 (shown as 331a and 331b), two apertures or ports 332 (shown as 332a and 332b), and two objective lenses 333 (shown as 333a and 333b) to focus the corresponding electron beams 335 (shown as 335a and 335b) on the semiconductor substrate 20. The apparatus 310 may be operated in a manner generally similar to that discussed above with reference to FIG. 5. One advantage of the apparatus 310 shown in FIG. 6, when compared to the apparatus 210 shown in FIG. 5, is that the electron beams 335a and 335b may be individually controlled because they are emitted from separate electron guns 330a and 330b, respectively. Conversely, an advantage of the apparatus 210 shown in FIG. 5 is that the single electron gun 230 may be less expensive to install and maintain than the dual electron guns 330a and 330b shown in FIG. 6.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for determining a dimension of a semiconductor device feature, comprising:

first and second sources of electrons;

a first lens positioned proximate to the first source of electrons to receive a first electron beam emitted therefrom;

a second lens positioned proximate to the second source of electrons to receive a second electron beam emitted therefrom;

a plate having a first port and a second port extending through a thickness thereof, the first port spaced apart from the first lens to receive the first electron beam passing through the first lens, the second port spaced apart from the first port and from the second lens to receive the second electron beam passing through the second lens;

a third lens configured to focus the first electron beam on a first position surface and positioned to receive the first electron beam passing through the first port;

a fourth lens configured to focus the second electron beam on a second position surface and positioned to receive the second electron beam passing through the second port; and a support configured to engage the semiconductor device and located to receive the first and the second electron beams, at least one of the support and the sources of electrons being movable relative to each other.

2. The apparatus of claim 1 wherein the support is movable relative to the sources of electrons in a direction generally transverse to at least one of the first and second electron beams.

3. The apparatus of claim 1 wherein the support is movable relative to the sources of electrons in a direction generally aligned with an axis of at least one of the first and second electron beams.

4. The apparatus of claim 1, further comprising a first detector spaced apart from the support to receive a first flow of electrons from the semiconductor device and generate a first signal corresponding thereto, and a second detector spaced apart from the support to receive a second flow of electrons reflected from the semiconductor device and generate a second signal corresponding thereto.

5. The apparatus of claim 4, further comprising a third detector operatively coupled to either the support or one of the sources to detect movement of either the support or one of the sources, the third detector generating a third signal corresponding to movement detected thereby.

6. The apparatus of claim 5, further comprising a memory device coupled to at least one of the first, second and third detectors to store the signal generated by the at least one detector.

7. The apparatus of claim 5, further comprising a display coupled to at least one of the first, second and third detectors to graphically display a strength of the first and second electron flows as a function of the movement detected by the third detector.

8. The apparatus of claim 5, further comprising a printing device coupled to at least one of the first, second and third detectors to print a representation of a strength of the first and second flows of electrons as a function of the movement detected by the third detector.

* * * * *